(12) United States Patent
Chang et al.

(10) Patent No.: US 9,868,630 B2
(45) Date of Patent: Jan. 16, 2018

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Kai-Fung Chang, Taipei (TW); Len-Yi Leu, Hsinchu (TW); Lien-Yao Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/237,639

(22) Filed: Aug. 16, 2016

(65) Prior Publication Data

US 2017/0334711 A1 Nov. 23, 2017

Related U.S. Application Data

(60) Provisional application No. 62/339,098, filed on May 20, 2016.

(51) Int. Cl.
*B81B 7/00* (2006.01)
*B81C 3/00* (2006.01)

(52) U.S. Cl.
CPC ............. *B81B 7/007* (2013.01); *B81C 3/001* (2013.01); *B81B 2203/0315* (2013.01); *B81C 2203/036* (2013.01)

(58) Field of Classification Search
CPC ..... B81B 7/007; B81B 7/0048; B81B 7/0077; B81B 7/00777; B81C 3/001
See application file for complete search history.

(56) References Cited

U.S. PATENT DOCUMENTS

| 2006/0208326 | A1* | 9/2006 | Nasiri | B81C 1/00238 257/414 |
| 2013/0043510 | A1* | 2/2013 | Shu | B81C 1/00269 257/254 |
| 2015/0158716 | A1* | 6/2015 | Cheng | B81B 3/001 257/254 |
| 2015/0311178 | A1* | 10/2015 | Shin | B81C 1/00238 438/109 |
| 2016/0318757 | A1* | 11/2016 | Cho | B81C 1/00595 |

\* cited by examiner

*Primary Examiner* — Whitney T Moore
*Assistant Examiner* — Joseph Galvin, III
(74) *Attorney, Agent, or Firm* — JCIPRNET

(57) ABSTRACT

A package structure includes a device chip, a MEMS die, a cap structure, and an eutectic bonding layer. The MEMS die is over the device chip and includes a substrate having a plurality of cavities and a conductive layer covering a bottom surface and sidewalls of each of the cavities. The cap structure is coupled to the MEMS die, and the cap structure includes a base substrate having at least one seal ring located in the cavities and a bonding layer covering a first surface and at least part of sidewalls of the seal ring. The first surface of the seal ring faces the MEMS die. The eutectic bonding layer is located between the conductive layer and the bonding layer in the cavities. In addition, a method of manufacturing the package structure is provided.

20 Claims, 12 Drawing Sheets

PACKAGE STRUCTURE AND MANUFACTURING METHOD THEREOF

CROSS-REFERENCE TO RELATED APPLICATION

This application claims the priority benefits of U.S. provisional application Ser. No. 62/339,098, filed on May 20, 2016. The entirety of the above-mentioned patent application is hereby incorporated by reference herein and made a part of this specification.

BACKGROUND

Micro-electro mechanical system (MEMS) devices are a recent development in the field of integrated circuit technology. MEMS devices are micro-machined sensors, actuators, and other structures that are formed by the addition, subtraction, modification, and patterning of materials using techniques originally developed for the semiconductor device/integrated circuit industry. Due to benefits such as miniaturization in size and simple integration into the integrated circuit manufacturing process, MEMS devices have become increasingly popular.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
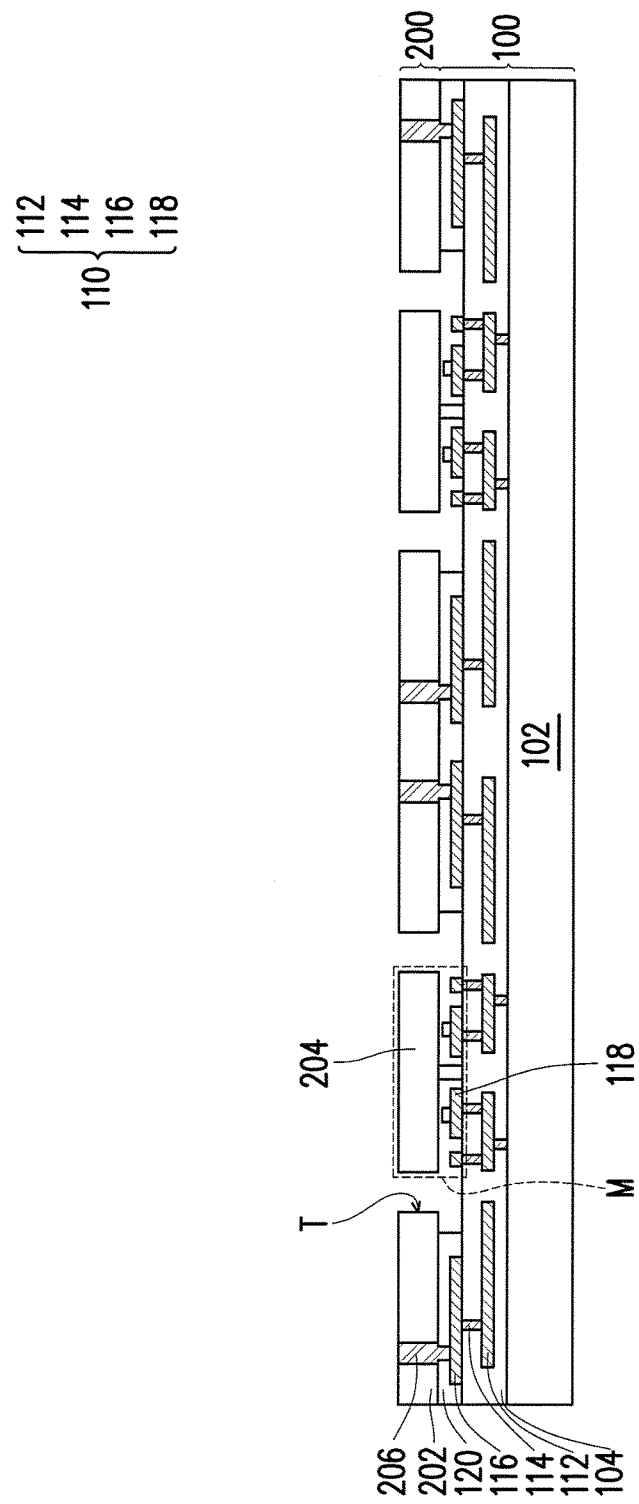
FIGS. 1A-1J are cross-sectional views of a method for manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1J are cross-sectional views of a method for manufacturing a package structure 10 in accordance with some embodiments. Referring to FIG. 1A, in some embodiments, a device wafer 100 is provided. In certain embodiments, the device wafer 100 includes a substrate 102, a first dielectric layer 104, an interconnection structure 110, and a second dielectric layer 120.

In some embodiments, the substrate 102 may be a semiconductor substrate that includes an elementary semiconductor including silicon and/or germanium; a compound semiconductor including silicon carbide, gallium arsenide, gallium phosphide, indium phosphide, indium arsenide, and/or indium antmonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe can be formed over a silicon substrate. The SiGe substrate may be strained. Furthermore, in alternative embodiments, the substrate 102 may be a semiconductor on insulator (SOI). In some embodiments, the substrate 102 includes a doped epi layer. In other embodiments, the substrate 102 include a multilayer compound semiconductor structure.

In some embodiments, the substrate 102 includes at least one integrated circuit structure formed thereon. For example, the integrated circuit structure may be a logic circuit, an analog circuit, a mixed-signal circuit, and/or any suitable integrated circuit formed by a complementary metal-oxide-semiconductor (CMOS) technology. That is, in some embodiments, the device wafer 100 may be referred to as a CMOS wafer. The substrate 102 may further include one or more active devices such as transistors, diodes, photodiodes, optoelectronic devices and the like or various passive devices such as capacitors, resistors, inductors, fuses, antenna and the like.

In FIG. 1A, the first dielectric layer 104 is located over the substrate 102. In some embodiments, a material of the first dielectric layer 104 includes silicon oxide, silicon nitride, silicon carbide, silicon oxynitride, silicon oxycarbide, or a low dielectric constant (low-k) material with a dielectric constant lower than 4, for example. A method of forming the first dielectric layer 104 includes, for example, thermal oxidation, spin-coating, deposition, a combination thereof, or the like.

In some embodiments, the interconnection structure 110 at least includes a first metallic layer 112, a plurality of via plug structures 114, a second metallic layer 116, and a third metallic layer 118. The first metallic layer 112 and the via plug structure 114 are embedded in the first dielectric layer 104. The second metallic layer 116 and the third metallic layer 118 are formed on the first dielectric layer 104 for further connection or for capacitance generating purposes. In some embodiments, the second metallic layer 116 and the third metallic layer 118 are the same metallization layer formed through the same process. Moreover, in some embodiments, the substrate 102, the first metallic layer 112, the second metallic layer 116, and the third metallic layer 118 are electrically coupled to each other through the via plug structures 114. The first metallic layer 112, the via plug structure 114, the second metallic layer 116, and the third metallic layer 118 may respectively include materials such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), indium (In), other suitable metallic materials, and/or any combinations thereof. It should be noted that some metallic layers in the interconnection structure 110 are omitted in the illustration presented in FIG. 1A for simplicity. However, in some embodiments, other than the first metallic layer 112, the second metallic layer 116, and the third metallic layer 118, the interconnection structure 110 may also include additional metallic layers embedded in the first dielectric layer 104 based on the circuit design.

In certain embodiments, the second dielectric layer 120 is disposed over the second metallic layer 116 and exposes at least a portion of the second metallic layer 116 for future electrical connection purposes. In some embodiments, the second dielectric layer 120 may include silicon oxide or oxide of other elements. For example, the oxide can include high density plasma (HDP) oxide, tetraethylorthosilicate (TEOS) oxide, or plasma enhanced TEOS (PETEOS) oxide.

Referring to FIG. 1A again, a MEMS wafer 200 is provided over the device wafer 100. The MEMS wafer 200 includes a substrate 202, a plurality of MEMS elements 204, and a plurality of conductive pillars 206. In some embodiments, the MEMS elements 204 include MEMS resonators, MEMS accelerometers, MEMS modulators, MEMS varactors or other MEMS elements. A material of the substrate 202 may be identical to or different from that of the substrate 102, and the details are not repeated herein. In some embodiments, the conductive pillars 206 are embedded in the substrate 202 and the MEMS wafer 200 is electrically connected to the device wafer 100 through the conductive pillars 206. For example, the conductive pillar 206 may be electrically connected to the second metallic layer 116 of device wafer 100 through the opening formed in the second dielectric layer 120. A material of the conductive pillar 206 may include materials such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), indium (In), other suitable metallic materials, and/or any combinations thereof.

In some embodiment, the device wafer 100 and the MEMS wafer 200 are bonded through oxide-oxide fusion bonding. In one embodiment, as the outermost layer (second dielectric layer 120) of the device wafer 100 is an oxide layer or includes an oxide layer, a native oxide or thermal oxide layer (not shown) of the MEMS wafer 200 may be bonded with the device wafer 100 through oxide-oxide fusion bonding. For example, the MEMS wafer 200 is bonded to the device wafer 100 at a temperature below 400° C., with a bonding force less than about 5N and a bonding time less than about 10 minutes. In some alternative embodiments, other types of fusion bonding technique may be utilized to bond the MEMS wafer 200 and the device wafer 100. For example, the fusion bonding process may arise from Si/Si bonding, $SiO_2$/Si bonding, and/or other suitable bonding. The fusion bonding process may involve bringing the wafers into intimate contact, which causes the substrates to hold together due to atomic attraction forces (i.e., Van der Waal forces). The wafers may be subjected to an annealing process, after which a stable bonding may be formed between the wafers. A temperature for the annealing process may be any suitable temperature, such as between about 200° C. and about 350° C.

As illustrated in FIG. 1A, in some embodiments, the MEMS elements 204 are separated from the substrate 202 through trenches T, and the MEMS elements 204 are also separated from the third metallic layer 118 of the device wafer 100. In one embodiment, the MEMS element 204 includes a lever structure that is not in contact with the third metallic layer 118 of the device wafer 100, and the lever structure and the third metallic layer 118 under the lever structure constitute a MEMS device M. In some embodiments, the MEMS elements 204 may serve as an electrode in which a capacitance is generated between the MEMS element 204 and the third metallic layer 118. In certain embodiments, the MEMS elements 204 are moveable during the operation of the MEMS device M. For example, as the beam of the lever structure is inclined during the operation and the gap (distance) between the MEMS elements 204 and the third metallic layer 118 is varied, a variation in capacitance is thus generated.

Figure 1B:
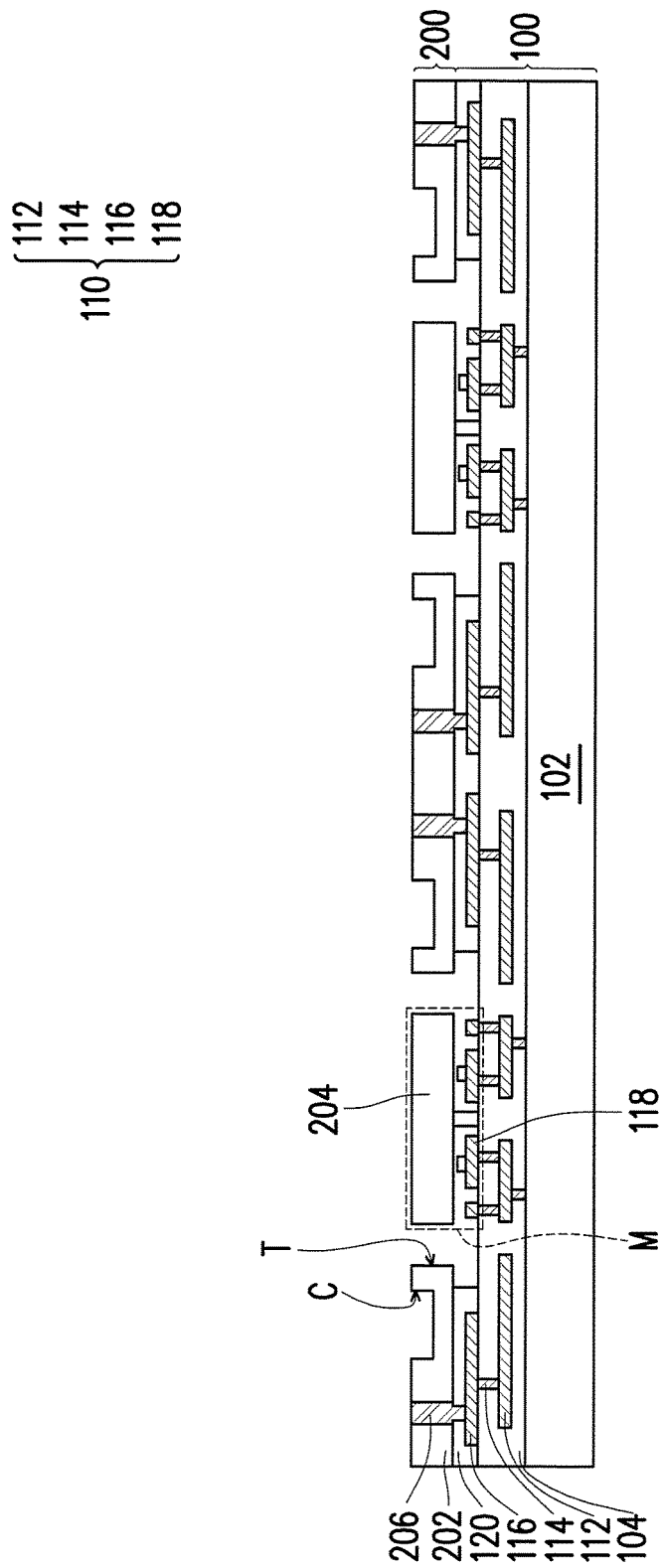
Figure 2:
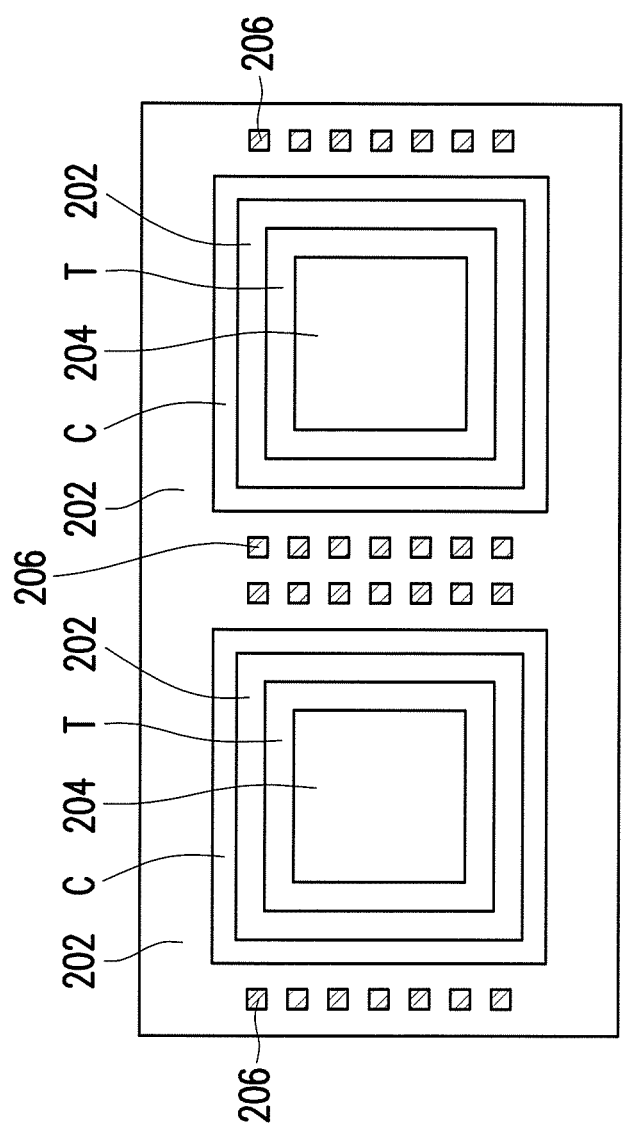
FIG. 2 is a schematic top view of a MEMS wafer in FIG. 1B.

Referring to FIG. 1B, the substrate 202 of the MEMS wafer 200 is patterned to form a plurality of cavities C. In some embodiments, the cavities C are formed through photolithography and etching techniques. In some alternative embodiments, mechanical drilling processes such as a laser drilling process may also be utilized to form the cavities C. FIG. 2 is a schematic top view of the exemplary MEMS wafer in FIG. 1B. In some embodiments, the trenches T and the cavities C are shaped as square rings and arranged concentrically, as illustrated in FIG. 2. However, the shape illustrated in FIG. 2 merely serves as an exemplary embodiment of the disclosure and construes no limitation in the disclosure. The trenches T and the cavities C may take other polygonal shapes or forms or arranged non-concentrically in alternative embodiments. For example, the trenches T and the cavities C may also be shaped as circular rings, semi-circular rings, or other suitable shapes.

Figure 1C:
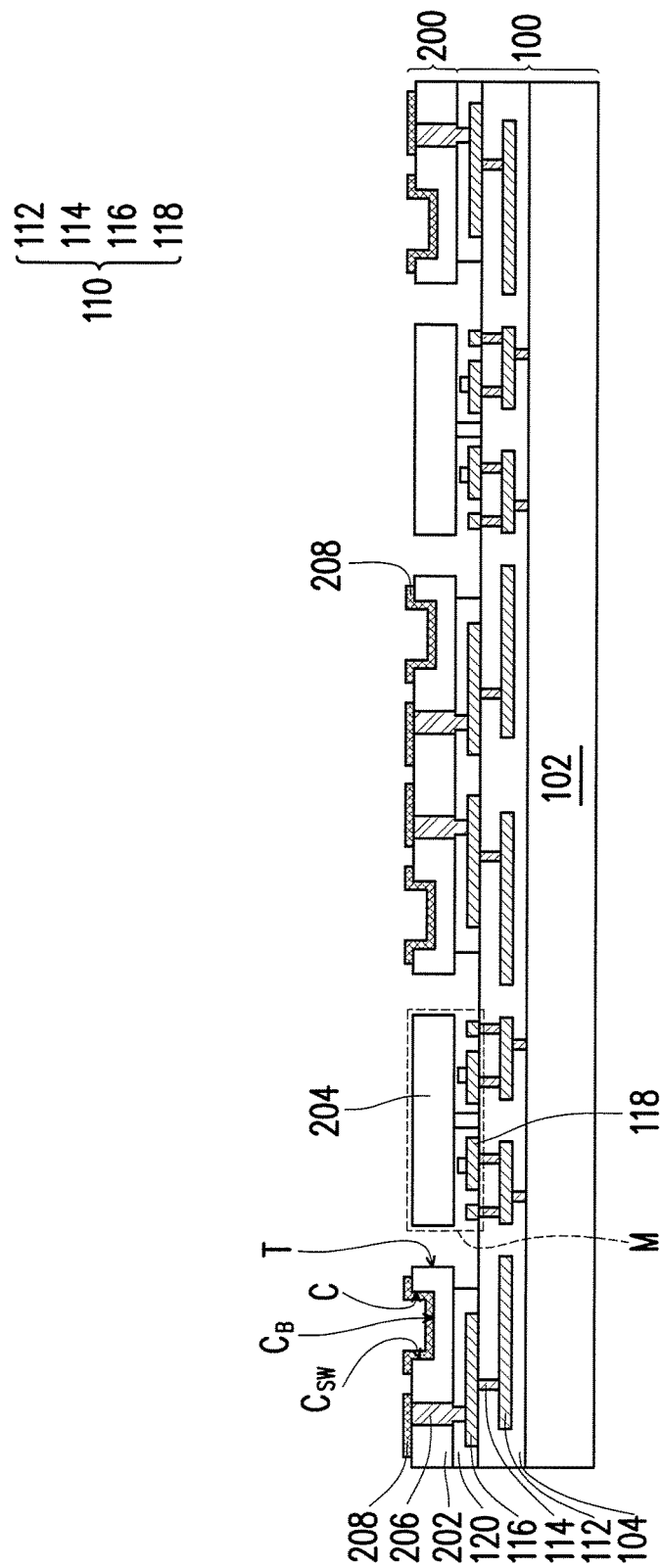

Referring to FIG. 1C, in some embodiments, a conductive layer 208 is formed over the substrate 202 of the MEMS wafer 200 and over the cavities C. Specifically, in certain embodiments, a conductive material layer (not illustrated) is formed over the substrate 202 and in the cavities C in a conformal manner, and the conductive material layer is later patterned through photolithography and etching processes to form the conductive layer 208. In some embodiments, the conductive layer 208 is formed conformally covering the cavities C such that the conductive layer 208 covers a bottom surface $C_B$ and sidewalls $C_{SW}$ of the cavities C and a portion of the conductive layer 208 is disposed on the substrate 202 at edges of the cavities C. On the other hand, another portion of the conductive layer 208 is located over the conductive pillars 206 and is electrically connected to the conductive pillars 206. A material of the conductive layer 208 may be identical to or different from the material of the conductive pillar 206, as long as the material of the conductive layer 208 is appropriate for the subsequent eutectic bonding processes. In some embodiments, the material of the conductive layer 208 includes aluminum (Al), copper (Cu), silicon (Si), germanium (Ge), gold (Au), tin (Sn), indium (In), other suitable metallic materials, and/or any combinations thereof. Herein, the processing steps of the device wafer 100 and the MEMS wafer 200 are substantially completed. A processing step of a cap wafer 300 will be described in detail below.

Figure 1D:
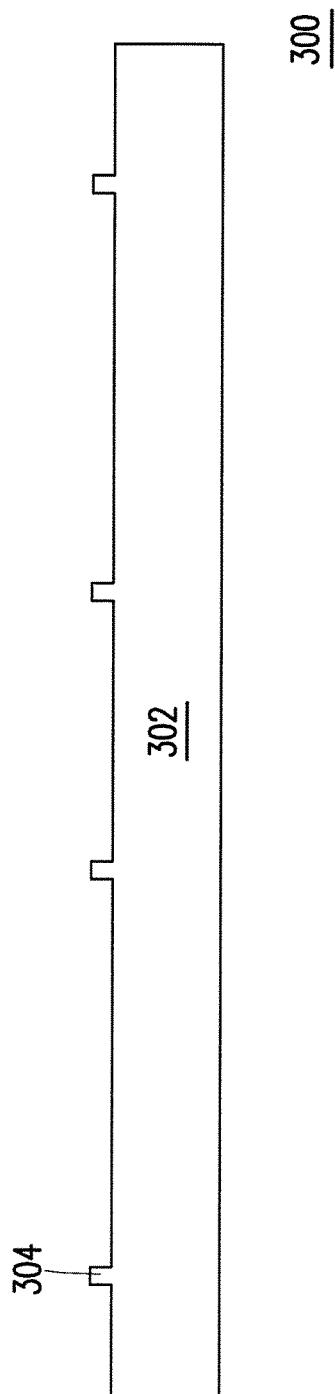

Referring to FIG. 1D, the cap wafer 300 is provided. The cap wafer 300 may be a semiconductor substrate, and a material of the cap wafer 300 includes, but not limited to, elementary semiconductor including silicon and/or germanium; a compound semiconductor including silicon carbide, gallium arsenide, gallium phosphide, indium phosphide, indium arsenide, and/or indium antmonide; an alloy semiconductor including SiGe, GaAsP, AlInAs, AlGaAs, GaInAs, GaInP, and/or GaInAsP; or combinations thereof. In some embodiments, the cap wafer 300 includes a base substrate 302 and may further include various passive devices such as capacitors, resistors, inductors, fuses, antenna and the like or active devices such as transistors, diodes, photodiodes, optoelectronic devices and the like. In some alternative embodiments, the cap wafer 300 may be free from active devices and integrated circuit and is merely a cap structure which serves the function of sealing the MEMS devices M in the subsequent processes. The base substrate 302 of the cap wafer 300 is patterned to form a plurality of first sub-protrusions 304, as illustrated in FIG. 1D. The first sub-protrusions 304 may be formed through photolithography and etching processes.

Figure 1E:
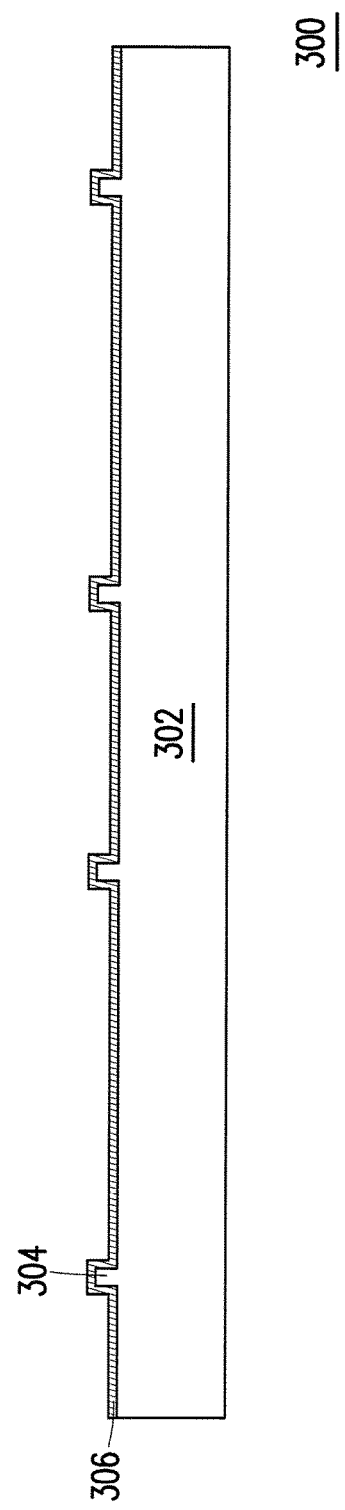

Referring to FIG. 1E, a bonding material layer 306 is formed over the base substrate. The bonding material layer 306 includes materials suitable for the subsequent eutectic bonding processes, such as aluminum (Al), copper (Cu), silicon (Si), germanium (Ge), gold (Au), tin (Sn), indium (In), other suitable metallic materials, and/or any combinations thereof.

Figure 1F:
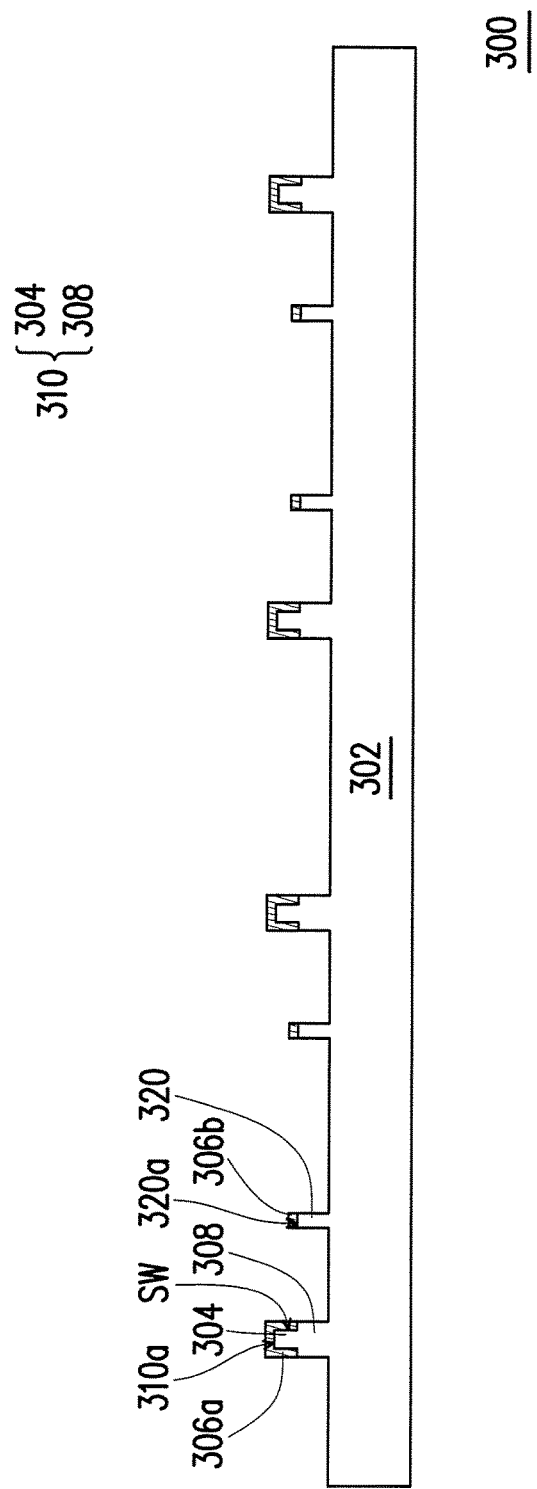

Referring to FIG. 1F, in some embodiments, a plurality of first protrusions 310, a plurality of second protrusions 320, a patterned bonding layer 306a, and an anti-stiction layer 306b are formed by performing a photolithography and etching process to pattern the bonding layer 306 and the base structure 302. In one embodiment, with a mask pattern (not shown) covering the locations corresponding to the first and second protrusions, the base substrate 302 and the bonding material layer 306 are further patterned to from the second protrusions 320 and the anti-stiction layer 306b on the second protrusions 320 as well as second sub-protrusions 308 underneath the first sub-protrusions 304 and the bonding layer 306a covering the first sub-protrusions 304 and over the second sub-protrusions 308. The first sub-protrusions 304 and the second sub-protrusions 308 constitute the first protrusions 310, and the first sub-protrusions 304 may be referred as first portions of the first protrusions 310 while the second sub-protrusions 308 may be referred as second portions of the first protrusions 310. The second portions 308 connect the first portions 304 and the base substrate 302. The bonding layer 306a covers the first portions 304 of the first protrusions 310. In detail, the bonding layer 306a covers a first surface 310a and part of the sidewalls SW of the first protrusions 310. Herein, the first surface 310a is, for example, a top surface of the first portion 304 as shown in FIG. 1F. It should be noted that since the second portions 308 and the bonding layer 306a are formed through the same photolithography and etching process, the bonding layer 306a is substantially aligned with sidewalls of the second portions 308, as illustrated in FIG. 1F.

Figure 3:
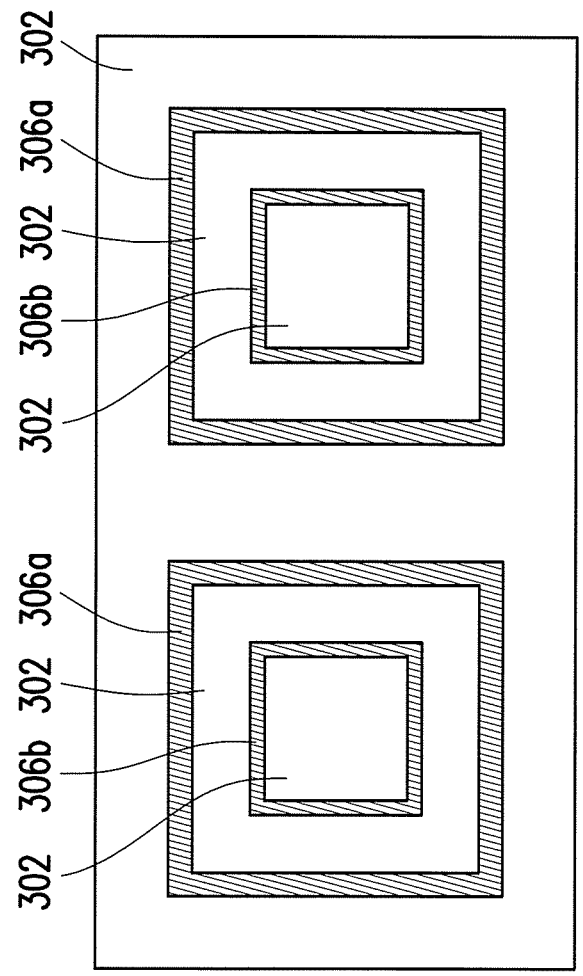
FIG. 3 is a schematic top view of a cap wafer in FIG. 1F.

In some embodiments, along with the bonding layer 306a and the second portions 308 of the first protrusions 310, the second protrusions 320 and the anti-stiction layer 306b over the first surface 320a of the second protrusions 320 are also formed through the same photolithography and etching process. Herein, the first surface 320a of the second protrusions 320 is, for example, a top surface of the second protrusions as shown in FIG. 1F. In some embodiments, a height of the second protrusions 320 is less than a height of the first protrusions 310. In certain embodiments, the second protrusions 320 are located between two adjacent first protrusions 310 in a cross-sectional view, as illustrated in FIG. 1F. Referring to FIG. 3, which is a schematic top view of the exemplary cap wafer 300 in FIG. 1F. As illustrated in FIG. 3, in some embodiments, the first protrusions 310 and the second protrusions 320 are square ring shaped and are arranged concentrically (shown as two first protrusions 310 and two second protrusions 320 in FIG. 1F). In other words, the first protrusions 310 may be referred as seal rings. From the perspective of top view, the second protrusions 320 are surrounded by the seal rings 310. Since the seal rings 310 of the cap wafer 300 are to be inserted or fitted into the cavities C of the MEMS wafer 200, the shape of the seal rings 310 is not limited as long as a match is found between the shape of the seal rings 310 and the shape of the cavities C or the shapes are compatible. For example, in some alternative embodiments, the seal rings 310 may be circular ring shaped, semi-circular ring shaped, or in other suitable shapes.

In some embodiments, the bonding layer 306a and the anti-stiction layer 306b are formed from the same layer and the materials of these two layers are the same, as illustrated in FIG. 1E to FIG. 1F. In some embodiments, these two layers are simultaneously formed or sequentially formed. In certain embodiments, as the bonding layer 306a and the anti-stiction layer 306b are formed from the same bonding material layer 306, the material of the bonding material layer 306 not only is suitable for eutectic bonding in the subsequent processes, but also has an anti-stiction property. For example, germanium is excellent in eutectic bonding while provides a notable anti-stiction property, and thus may be utilized as the bonding material in some embodiments of the disclosure. However, in some alternative embodiments, other materials satisfying foregoing properties may also be used. Alternatively, in some other embodiments, the bonding layer 306a and the anti-stiction layer 306b are formed in different processes. For example, the bonding layer 306a may be formed first, and the anti-stiction layer 306b may be formed in the subsequent processes. Under this scenario, the materials of the bonding layer 306a and the anti-stiction layer 306b may be different, as long as the materials of the bonding layer 306a and the anti-stiction layer 306b are able to provide good eutectic bonding strength and anti-stiction property respectively.

A surface treatment process is optionally performed to the bonding layer 306a. Specifically, native oxide on the bonding layer 306a may be removed to roughen a bonding surface of the bonding layer 306a, thereby allowing enhanced bonding in the subsequent bonding process. Herein, the processing step of the cap wafer 300 is substantially completed. A bonding process of the cap wafer 300 and the MEMS wafer 200 will be described in detail below.

Figure 1G:
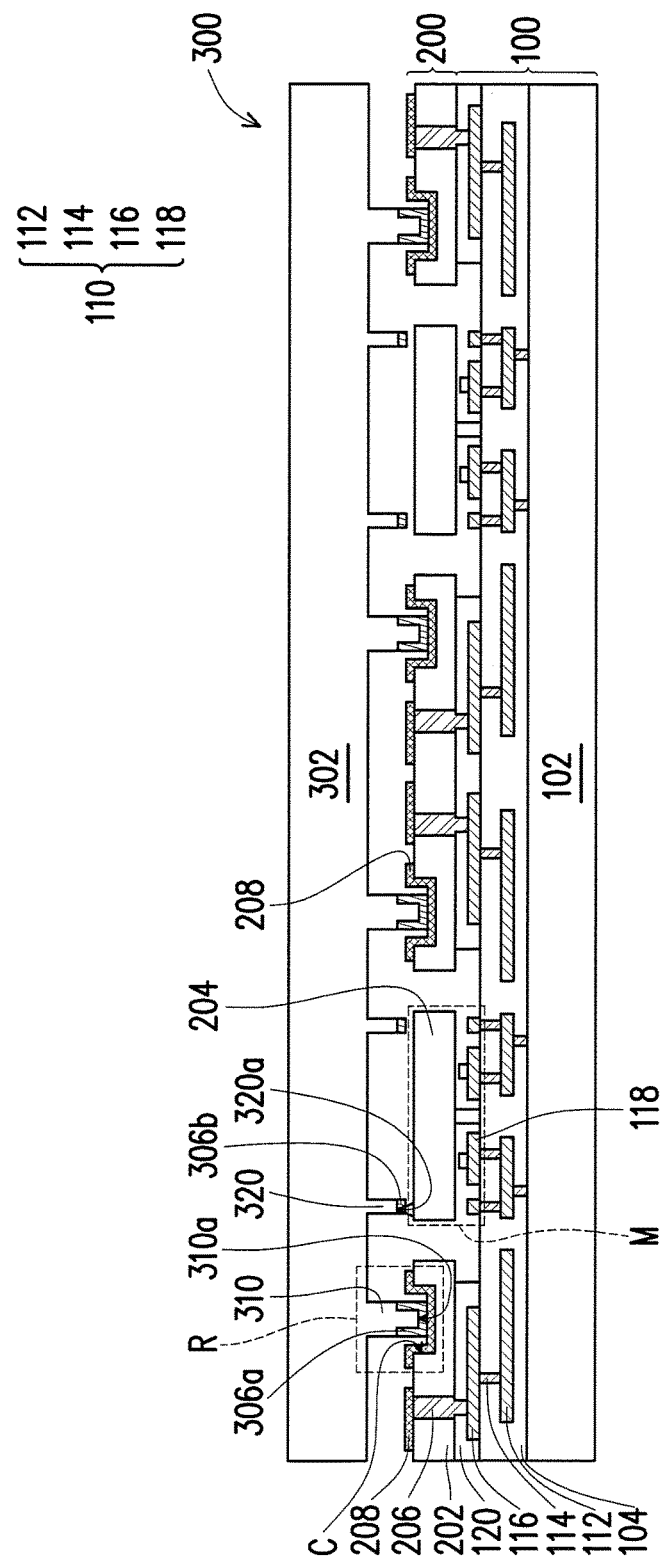

Referring to FIG. 1G, the cap wafer 300 is flipped upside down and placed over the MEMS wafer 200 such that the first surface 310a of the seal rings 310 and the first surface 320a of the second protrusions 320 face the MEMS wafer 200. The seal rings 310 are aligned and fitted into the cavities C. On the other hand, the second protrusions are disposed above the MEMS wafer 200 and are disposed corresponding to the positions of the MEMS devices M without touching the MEMS devices M. As mentioned above, the MEMS elements 204 are adjustably moveable, and thus the second protrusions 320 may serve as a stopping mechanism or bumpers for the movement of the MEMS elements 204 during the operation. Thus, the second protrusions 320 may be referred as stopper protrusions. In some embodiments, the cap wafer 300 is brought into contact with the MEMS wafer 200 such that the bonding layer 306a and the conductive layer 208 are in contact with each other. In some alternative embodiments, the bonding layer 306a and the conductive layer 208 are not in contact with each other, but are brought into close proximity sufficient enough for the subsequent bonding process.

Figure 4:
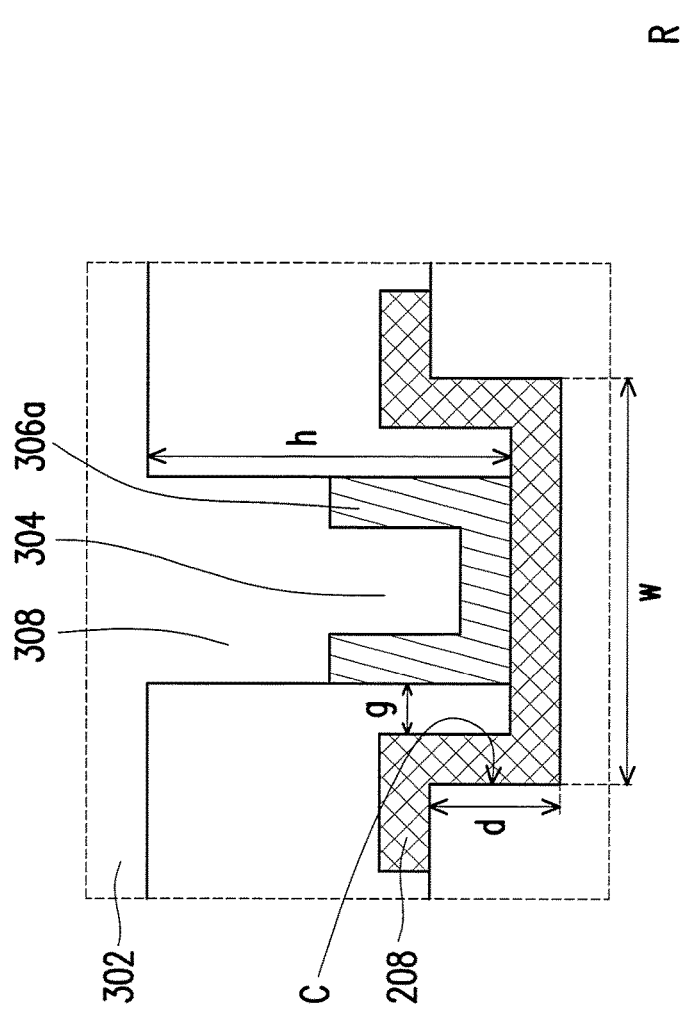
FIG. 4 is a schematic enlarged cross-sectional view of region R in FIG. 1G.

FIG. 4 is a schematic enlarged cross-sectional view of region R in FIG. 1G. Referring to FIG. 4, the dimensions or relative positions of the seal ring 310 and the cavity C are merely exemplary for illustration purposes but are not intended to limit the structural elements herein. The cavity C has a depth d of approximately 1 m to 30 m and a width w of approximately 10 μm to 100 μm. On the other hand, a maximum gap g between the conductive layer 208 and the bonding layer 306a is approximately 1 μm to 20 μm. In some embodiments, a width of the seal ring 310 is smaller than the width of the cavity C and the maximum gap g can be found between the conductive layer 208 and the bonding layer 306a such that the seal ring 310 is easily fitted into the cavity C. Moreover, a sum h of a height of the seal ring 310 and a thickness of the bonding layer 306a is approximately 2 μm to 150 μm. In some embodiments, the first portion 304 of the seal ring 310 is inserted into the cavity C. However, based on the sum h of the height of the seal ring 310 and the thickness of the bonding layer 306a, in some alternative embodiments, the first portion 304 and the second portion 308 are both inserted into the cavity C.

Figure 1H:
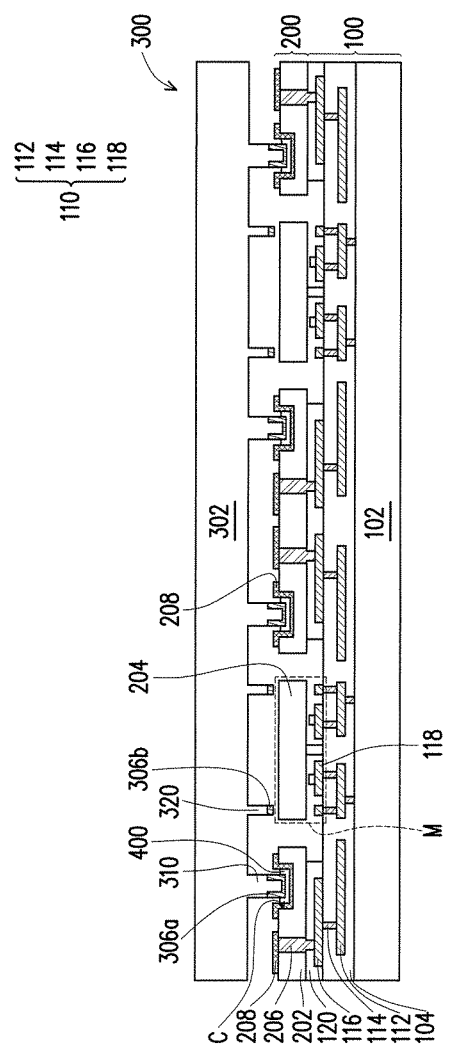

Referring to FIG. 1H, the cap wafer 300 and the MEMS wafer 200 are bonded through an eutectic bonding process. The eutectic bonding process makes use of the mechanism of eutectic bonding, which can be applied between any metal/alloy suitable for the bonding temperature boundary condition. For example, eutectic bonding of the eutectic bonding process may include metal/metal bonding and/or metal/semiconductor bonding, such as Cu—Sn, Au—Sn, Au—Si, Au—In, Au—Ge, Al—Si or Al—Ge bonding, and/or other suitable bonding. In some embodiments, during the eutectic bonding process(es), the cap wafer 300 and the MEMS wafer 200 are aligned and brought into close contact and then heated to a bonding temperature above the eutectic temperature so that eutectic bonding occurs between the conductive layer 208 and the bonding layer 306a within the cavities C. In certain embodiments, the bonding temperature of the eutectic bonding process may be any suitable temperature depending on the materials of the conductive layer and/or the bonding layer. Using the bonding layer comprising germanium and the conductive layer comprising aluminum as an example, the suitable bonding temperature ranges between about 400° C. and 450° C. It should be noted that not only the bonding temperature but also other bonding process parameters may be adjusted based on the materials of the conductive layer and/or the bonding layer used. After the eutectic bonding process, an eutectic bonding layer 400 is formed between the bonding layer 306a and the conductive layer 208 within the cavities C. Depending on the material selections of the bonding layer 306a and the conductive layer 208, the eutectic bonding layer 400 may include Cu—Sn alloy, Au—Sn alloy, Au—Si alloy, Au—In alloy, Au—Ge alloy, Al—Si alloy, Al—Ge alloy, and/or other suitable alloys. In some embodiments, since the bonding layer 306a on the seal rings 310 is fitted into the cavities C and the conductive layer 208 are located within the cavities C, the eutectic bonding process occurs in the cavities C. Therefore, the eutectic bonding layer 400 formed between the bonding layer 306a and the conductive layer 208 is located within the cavities C, which improves the overflow issues. In certain embodiments, as the bonding layer 306a covering sidewalls of the seal rings 310 is in contact with the conductive layer 208 conformally covering the cavities C, the eutectic bonding layer 400 of a larger eutectic bonding area is formed between the bonding layer 306a and the conductive layer 208, leading to the enhanced bonding with better reliability and satisfactory sealing effect.

Figure 1I:
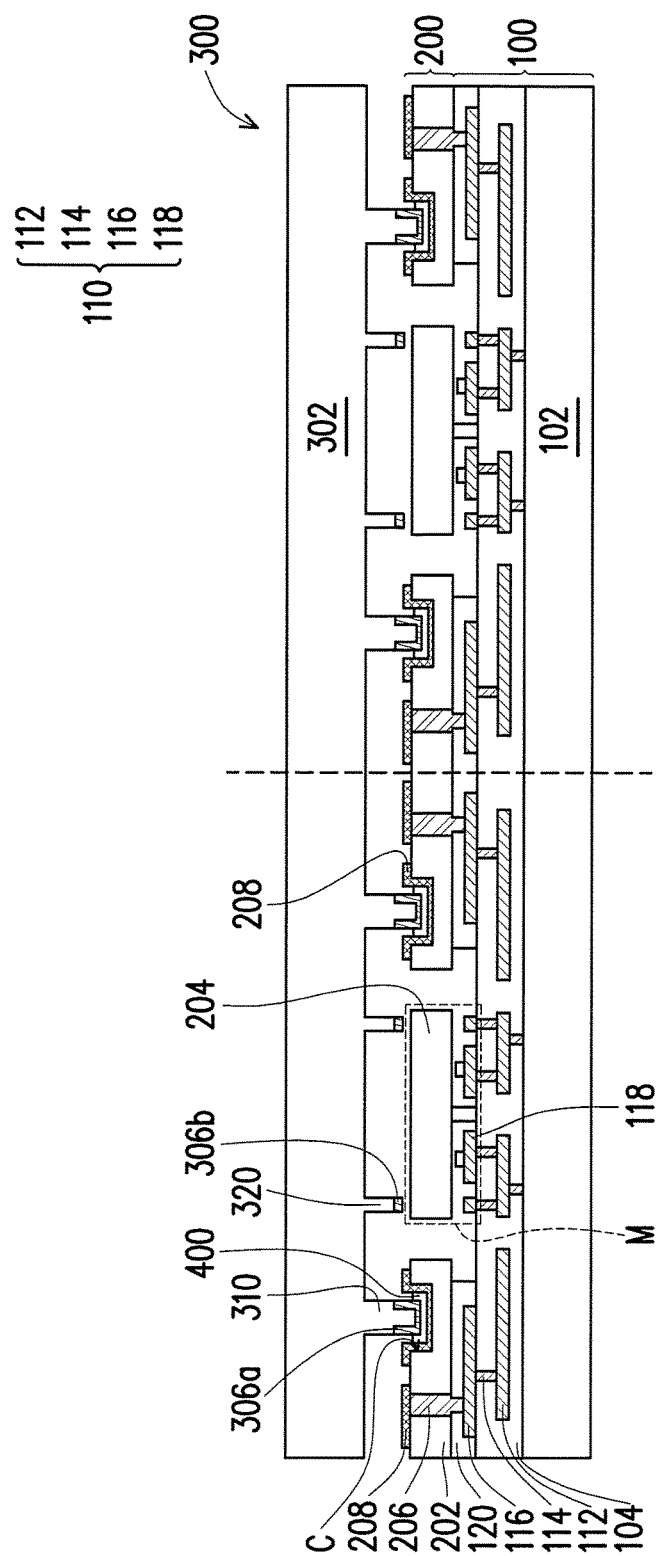

Referring to FIG. 1I, the bonded-together cap wafer 300, the MEMS wafer 200 and the device wafer 100 are diced to form a plurality of package structures 10. In some embodiment, the dicing process or singulation process typically involves dicing the bonded wafers with a rotating blade or a laser beam. In other words, the dicing or singulation process is, for example, a laser cutting process or a mechanical cutting process.

Figure 1J:
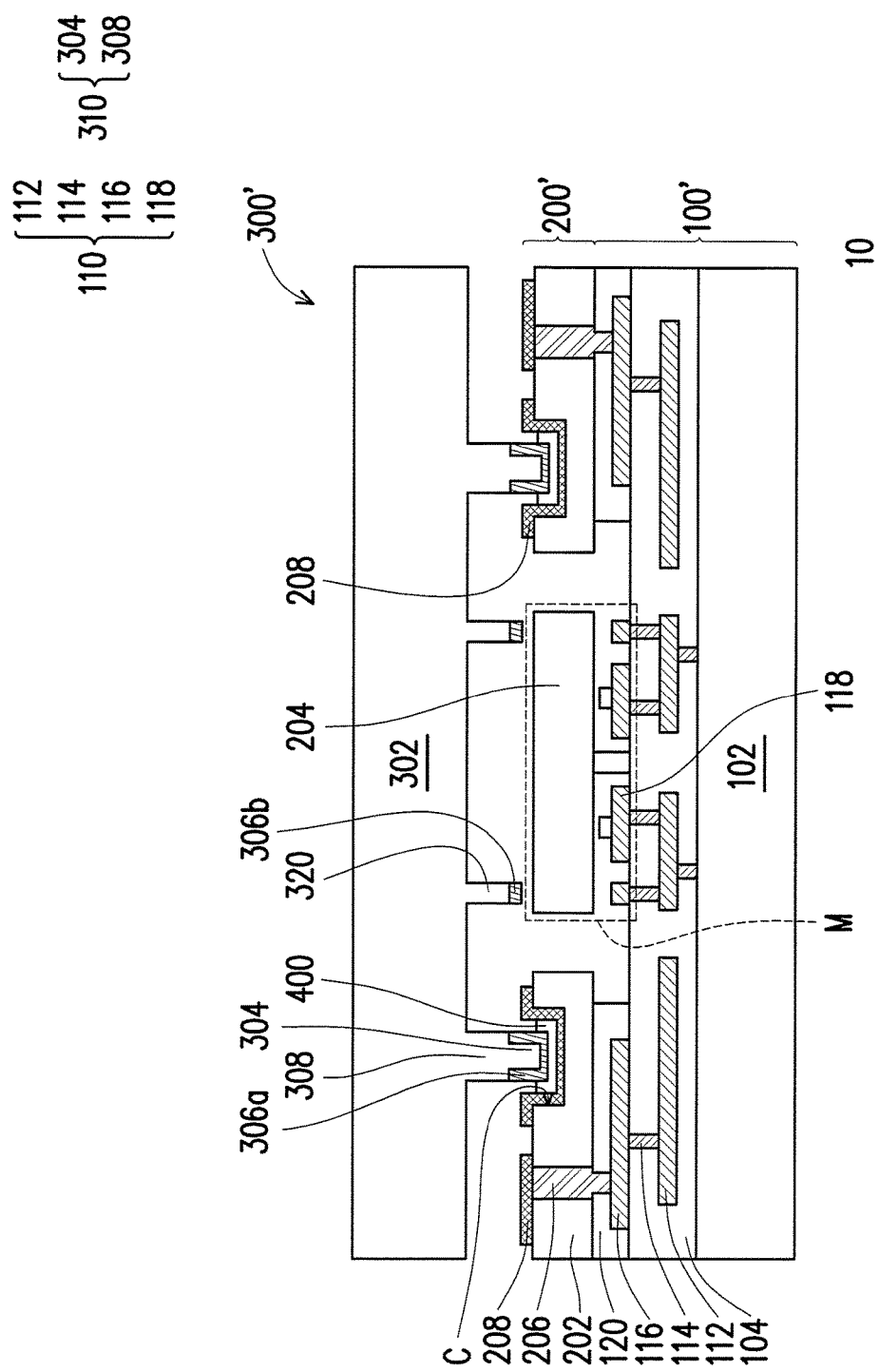

In FIG. 1J, in some embodiments, since the cap wafer 300, the MEMS wafer 200, and the device wafer 100 are diced into individual package structures 10 through the same dicing process, the widths of a cap structure 300', a MEMS die 200' and a device chip 100' in the package structure 10 are substantially the same. In some alternative embodiments, the cap wafer 300, the MEMS wafer 200, and the device wafer 100 may be singulated or diced by different singulation processes. Specifically, in alternative embodiments, the cap wafer 300 may be singulated by performing a grinding process such as chemical mechanical polishing (CMP). Subsequently, the MEMS wafer 200 and the device wafer 100 may be singulated or diced by a dicing process. Under this scenario, since the cap wafer 300, the MEMS wafer 200, and the device wafer 100 are not singulated or diced through the same process or at the same time, the width of the cap structure 300' is different from the widths of the MEMS die 200' and the device chip 100'. For example, the width of the cap structure 300' may be less than the widths of the MEMS die 200' and the device chip 100'.

Referring to FIG. 1J, the package structure 10 includes the device chip 100', the MEMS die 200', and the cap structure 300'. The MEMS die 200' is located on and electrically connected to the device chip 100'. The MEMS die 200' includes the substrate 202 having the cavities C, the MEMS elements 204, and the conductive layer 208 disposed within the cavities C and conformally covering each of the cavities C. The MEMS elements 204 of the MEMS die 200' and the third metallic layer 118 of the device chip 100' form a MEMS device M. The cap structure 300' is bonded to the MEMS die 200'. The cap structure 300' includes the base substrate 302 having the seal rings (first protrusions) 310, the stopper protrusions (second protrusions) 320, the bonding layer 306a, and the anti-stiction layer 306b. Each seal ring 310 includes the first portion 304 and the second portion 308, and the bonding layer 306a covers the first portion 304 and aligns with sidewalls of the second portion 308. The first portions 304 and the bonding layer 306 formed thereon are inserted or fitted into the corresponding cavities C. By aligning and fitting the seal rings 310 into the cavities C, eutectic bonding of a stronger strength and better reliability is achieved between the seal rings 310 and the cavities C through the formation of the eutectic bonding layer 400 there-between, thereby attaining a better hermetic seal. Moreover, since the eutectic bonding layer 400 is contained within the cavities C, no extra protective pattern such as overflow trench is required, thereby reducing the production cost while allowing tighter layout design and miniaturization in die sizes. On the other hand, the stopper protrusions (second protrusions) 320 having the anti-stiction layer 306b formed thereon are disposed corresponding to the MEMS device M. Since the location of the stopper protrusions 320 of the cap structure 300' corresponds to the location of the MEMS device M, the anti-stiction layer 306b on the stopper protrusions 320 is able to avoid the stiction of the moving or operating MEMS device M. It should be noted that in some embodiments, the anti-stiction layer 306b and the bonding layer 306a may be formed during the same process and/or formed with a same material. As such, the manufacturing cost may be further reduced, and the manufacturing procedure may be simplified.

In accordance with some embodiments of the present disclosure, a package structure includes a device chip, a MEMS die, a cap structure, and an eutectic bonding layer. The MEMS die is disposed over the device chip and includes a substrate having a plurality of cavities and a conductive layer covering a bottom surface and sidewalls of each of the cavities. The cap structure is coupled to the MEMS die, and the cap structure includes a base substrate having at least one seal ring located in the cavities and a bonding layer covering a first surface and at least part of sidewalls of the seal ring. The first surface of the seal ring faces the MEMS die. The eutectic bonding layer is located between the conductive layer and the bonding layer in the cavities.

In accordance with some embodiments of the present disclosure, a package structure includes a device chip, a MEMS die, a cap structure, and an eutectic bonding layer. The MEMS die is over and electrically connected to the device chip and includes a substrate having a plurality of cavities and a conductive layer disposed within and conformally covering each of the cavities. The cap structure is disposed on and coupled to the MEMS die, and the cap structure includes a base substrate and a bonding layer. The base substrate has a plurality of first protrusions and a plurality of second protrusions. The second protrusions are located between two adjacent first protrusions. Each of the first protrusions includes a first portion and a second portion, and the second portion connects the first portion and the base substrate. The first portion is inserted into the corresponding cavity. The bonding layer covers the first portion. The eutectic bonding layer is located between the conductive layer and the bonding layer in the cavities.

In accordance with some embodiments of the present disclosure, a method of manufacturing a package structure includes at least the following steps. A device wafer and a MEMS wafer over the device wafer are provided. The MEMS wafer is bonded with the device wafer. A plurality of cavities in a substrate of the MEMS wafer are formed. A conductive layer over the substrate of the MEMS wafer and in the cavities is formed. A cap wafer is provided. A plurality of seal rings in the cap wafer are formed. A bonding layer partially covering the seal rings are formed. The seal rings of the cap wafer are bonded with the cavities of the MEMS wafer through eutectic bonding of the bonding layer on the seal rings and the conductive layer within the cavities. Subsequently, the device wafer, the MEMS wafer, and the cap wafer are diced, so as to form a package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising
a device chip;
a MEMS die over the device chip, the MEMS die comprising:
a substrate having a plurality of cavities; and
a conductive layer covering a bottom surface and sidewalls of each of the cavities;
a cap structure coupled to the MEMS die, the cap structure comprising:
a base substrate having at least one seal ring, wherein the seal ring is located in the cavities; and
a bonding layer covering a first surface and at least part of sidewalls of the seal ring, wherein the first surface of the seal ring faces the MEMS die; and
an eutectic bonding layer located between the conductive layer and the bonding layer in the cavities.

2. The package structure according to claim 1, wherein part of the device chip and part of the MEMS die form a microelectromechanical system (MEMS) device.

3. The package structure according to claim 2, wherein the cap structure further comprises a plurality of stopper protrusions disposed corresponding to the MEMS device and surrounded by the seal ring, and a height of the stopper protrusions is less than a height of the seal ring.

4. The package structure according to claim 3, wherein the cap structure further comprises an anti-stiction layer over a first surface of the stopper protrusions, and the first surface of the stopper protrusions faces the MEMS device.

5. The package structure according to claim 4, wherein a material of the anti-stiction layer is the same as a material of the bonding layer.

6. The package structure according to claim 1, wherein the bonding layer aligns with another part of the sidewalls of the seal ring.

7. The package structure according to claim 1, wherein a material of the conductive layer comprises aluminum and a material of the bonding layer comprises germanium.

8. The package structure according to claim 1, wherein a material of the eutectic bonding layer comprises aluminum-germanium alloy.

9. A package structure, comprising
a device chip;
a MEMS die disposed over and electrically connected to the device chip, the MEMS die comprising:
a substrate having a plurality of cavities; and
a conductive layer disposed within and conformally covering each of the cavities;
a cap structure disposed on and coupled to the MEMS die, the cap structure comprising:
a base substrate having a plurality of first protrusions and a plurality of second protrusions, the second protrusions are located between two adjacent first protrusions, each of the first protrusions comprises a first portion and a second portion, the second portion connects the first portion and the base substrate, and the first portion is inserted into the corresponding cavity; and
a bonding layer covering the first portion; and
an eutectic bonding layer located between the conductive layer and the boding layer in the cavities.

10. The package structure according to claim 9, wherein part of the device chip and part of the MEMS die form a microelectromechanical system (MEMS) device.

11. The package structure according to claim 10, wherein the cap structure further comprises an anti-stiction layer over a first surface of the second protrusions, and the first surface of the second protrusions faces the MEMS device.

12. The package structure according to claim 11, wherein the second protrusions are disposed corresponding to the MEMS device.

13. The package structure according to claim 11, wherein a material of the anti-stiction layer is the same as a material of the bonding layer.

14. The package structure according to claim 9, wherein a material of the conductive layer comprises aluminum and a material of the bonding layer comprises germanium.

15. The package structure according to claim 9, wherein a material of the eutectic bonding layer comprises aluminum-germanium alloy.

16. The package structure according to claim 9, wherein the bonding layer aligns with sidewalls of the second portion of the first protrusions.

17. A method of manufacturing a package structure, comprising:
   providing a device wafer;
   providing a MEMS wafer over the device wafer;
   bonding the MEMS wafer with the device wafer;
   forming a plurality of cavities in a substrate of the MEMS wafer and forming a conductive layer over the substrate of the MEMS wafer and in the cavities;
   providing a cap wafer;
   forming a plurality of seal rings in the cap wafer and forming a bonding layer partially coveting the plurality of seal rings;
   bonding the plurality of seal rings of the cap wafer with the plurality of cavities of the MEMS wafer through eutectic bonding of the bonding layer on the plurality of seal rings and the conductive layer within the plurality of cavities; and
   dicing the device wafer, the MEMS wafer, and the cap wafer to form a package structure.

18. The method according to claim 17, wherein the step of forming a plurality of cavities in a substrate of the MEMS wafer and forming a conductive layer over the substrate of the MEMS wafer and in the cavities comprises:
   patterning the substrate of the MEMS wafer to form the plurality of cavities;
   forming a conductive material layer over the substrate and in the plurality of cavities in a conformal manner; and
   patterning the conductive material layer to form the conductive layer over the substrate and in the plurality of cavities.

19. The method according to claim 17, wherein the step of forming a plurality of seal rings on the cap wafer and forming a bonding layer partially covering the plurality of seal rings comprises:
   patterning a base substrate of the cap wafer to form first portions of the plurality of seal rings;
   forming a bonding material layer over the base substrate and the first portions;
   patterning the base substrate and the bonding material layer to form second portions of the plurality of seal rings and the bonding layer covering the first portions; and
   performing a surface treatment to the bonding layer.

20. The method according to claim 19, wherein the step of patterning the base substrate and the bonding material layer further comprises:
   forming a plurality of stopper protrusions and an anti-stiction layer over the plurality of stopper protrusions.

* * * * *